US006623597B1

(12) United States Patent
Han et al.

(10) Patent No.: US 6,623,597 B1
(45) Date of Patent: Sep. 23, 2003

(54) FOCUS RING AND APPARATUS FOR PROCESSING A SEMICONDUCTOR WAFER COMPRISING THE SAME

(75) Inventors: Oh-Yeon Han, Suwon (KR); Guk-Kwang Kim, Suwon (KR); Yun-Sik Yang, Suwon (KR); Byeung-Wook Choi, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/671,212

(22) Filed: Sep. 28, 2000

(30) Foreign Application Priority Data

Sep. 29, 1999 (KR) ............................................. 99-41795

(51) Int. Cl.[7] ........................ H01L 21/306; C23C 16/00
(52) U.S. Cl. ................... 156/345.51; 156/915; 118/728
(58) Field of Search ........................... 156/345.51, 915; 118/715–733

(56) References Cited

U.S. PATENT DOCUMENTS 5,474,649 A * 12/1995 Kava et al. ................. 438/729
5,789,324 A * 8/1998 Canale et al. ............... 438/714
6,344,105 B1 * 2/2002 Daugherty et al. ..... 156/345.51

\* cited by examiner

Primary Examiner—Shrive P. Beck
Assistant Examiner—Ram N Kackar
(74) Attorney, Agent, or Firm—Volentine Francos, PLLC

(57) ABSTRACT

An apparatus for processing a semiconductor wafer has a circular chuck and a focus ring. The chuck is located in a process chamber and holds the semiconductor wafer. The focus ring surrounds the semiconductor wafer held by the chuck and focuses processing gases or plasma on a surface of the semiconductor wafer. The focus ring has a stepped inner periphery formed by a cylindrical lower surface surrounding the wafer and having a first diameter, a cylindrical upper surface having a second diameter greater than the first diameter, and a collector interposed between the lower surface and the upper surface for collecting contaminants created at the upper surface due to a reaction between the processing media and the material of the focus ring. The collector collects particulate contaminants falling from the upper surface of the focus ring so that the contaminants do not reach the wafer.

12 Claims, 6 Drawing Sheets

FOCUS RING AND APPARATUS FOR PROCESSING A SEMICONDUCTOR WAFER COMPRISING THE SAME

BACKGROUND OF THE INVENTION

1. Field of the Invention

The present invention relates to an apparatus for manufacturing a semiconductor device. More particularly, the present invention relates to a focus ring for focusing plasma or a reaction gas onto a semiconductor wafer.

This application is a counterpart of, and claims priority to, Korean Patent Application No. 1999-41795, filed Sep. 29, 1999, the contents of which are incorporated herein by reference.

2. Description of the Related Art

Conventionally, semiconductor device manufacturing processes such as etching or chemical vapor deposition (CVD) are carried out using a plasma reactor. If the plasma is not distributed uniformly over the wafer, the semiconductor wafer will not be etched uniformly or the layer deposited thereon will not have a uniform thickness. A non-uniform plasma distribution can be caused by non-uniform gas flow across the semiconductor wafer, a non-uniform cathode temperature and/or variations in the intensity in an electric field induced within the reactor, etc. A vacuum pump disposed at the bottom of the plasma reactor continuously exhausts gas to the exterior thereof so that the level of the vacuum in the processing chamber of the reactor is maintained constant. The semiconductor wafer is held by a pedestal or chuck that is located at a center of the processing chamber. Plasma, which is introduced downwardly into the chamber, has a higher flow rate around the semiconductor wafer. Such a plasma reactor is disclosed in, for example, U.S. Pat. No. 5,685,914, entitled A Focus Ring For Semiconductor Wafer Processing In A Plasma Reactor, issued to Graham W. Hills et al. on Nov. 11, 1997.

The focus ring which is the subject of this patent is provided to facilitate a uniform etching of the wafer.

FIGS. 1 and 2 show such a conventional plasma reactor. Referring now to these figures, a vacuum chamber 102 has a gate valve 106 at a sidewall 104 thereof for enabling a semiconductor wafer 110 to enter/exit the chamber 102. The wafer 110 is held by a wafer chuck 112. The periphery of the wafer 110 rests on the wafer chuck 112, and is shielded by a focus ring 114 that surrounds the periphery.

During an etching process, an inner peripheral sidewall 114a of the focus ring 114 locks in charged processing gases on the wafer 110. This enhances the etching process and ensures that the rate at which the wafer 110 is etched is constant. However, the inner peripheral sidewall 114a chemically reacts with the processing gases to create by-products 118. These by-products 118 constitute particulate contaminants 118 in the chamber 102. As successive ones of the etching processes are carried out, the by-products 118 attached to the inner peripheral sidewall 114a grow or increase in number. The by-products 118 eventually fall upon the wafer 110 and thereby contaminate the wafer 110. Thus, these contaminants 118 lower the yield during the mass production of semiconductor devices.

SUMMARY OF THE INVENTION

It is therefore an object of the invention to provide a focus ring of an apparatus for processing a semiconductor wafer, which can prevent particulate contaminants adhering to an inner surface of the focus ring from later falling onto the wafer.

To achieve this object, the present invention provides a focus ring having a stepped inner periphery which is formed by a cylindrical bottom surface having a first diameter, a cylindrical top surface having a second diameter greater than the first diameter, and a collector located between the top surface and the bottom surface for collecting contaminants created at the top surface.

The apparatus for processing a semiconductor wafer includes a process chamber, a circular chuck and the focus ring. The chuck is located in the process chamber and holds the wafer. The focus ring focuses processing media onto a surface of the wafer that is held by the chuck. The cylindrical bottom surface of the focus ring extends around that portion of the chuck which supports the wafer.

The collector may form an upwardly facing concavity.

The collector is located beneath the inner upper surface so as to collect particulate contaminants falling therefrom. Thus, the particulate contaminants do not fall onto the semiconductor wafer, whereby the yield of products produced from the wafer is increased. Further, an RF (radio frequency) on time of the apparatus can be extended as much as two times or more the average RF on time of a conventional apparatus, whereby the productivity of the apparatus is enhanced.

BRIEF DESCRIPTION OF THE DRAWINGS

The above and other objects, features and advantages of the present invention will be apparent from the following description of preferred embodiments of the invention made with reference to accompanying drawings, of which.

DETAILED DESCRIPTION OF THE PREFERRED EMBODIMENTS

Figure 1:
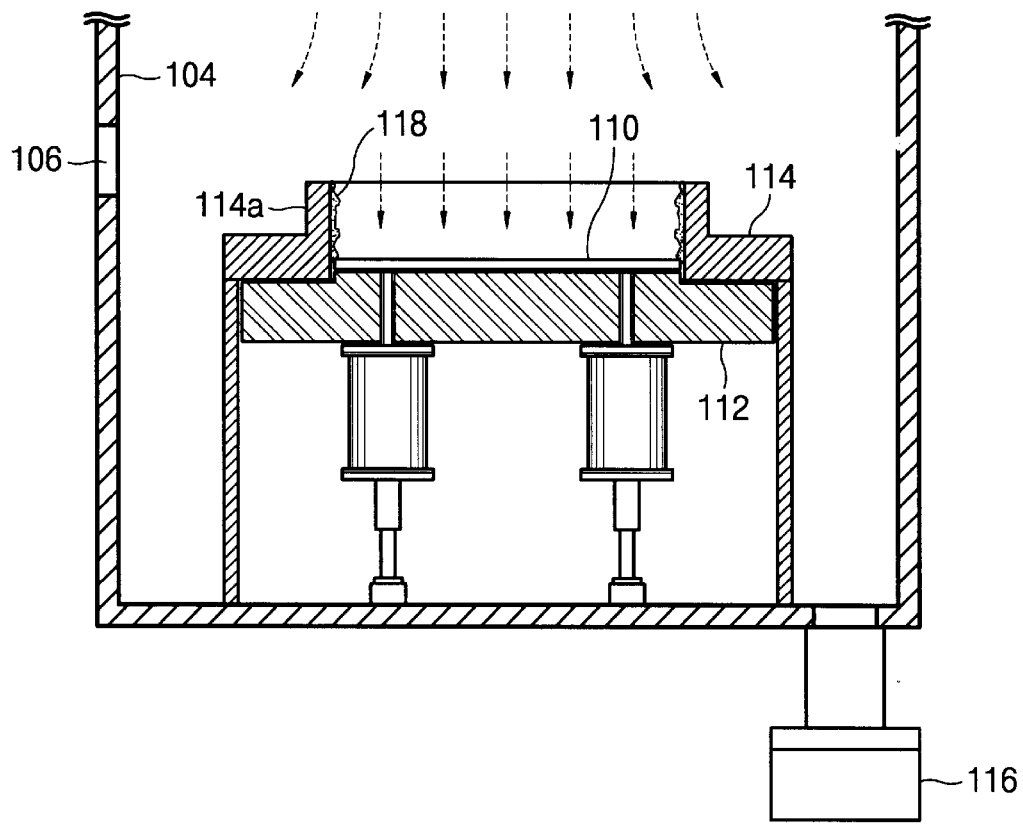
FIG. 1 is a schematic diagram of a conventional plasma reactor having a focus ring for carrying out an etching process.
Figure 2:
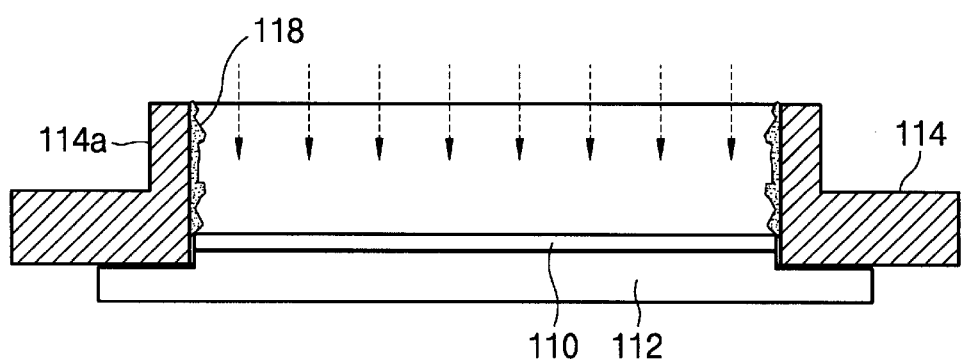
FIG. 2 is an enlarged cross-sectional view of the focus ring shown in FIG. 1.

The present invention will now be described hereinafter more fully with reference to the preferred embodiments thereof as shown in the accompanying drawings. It should be noted that like reference numerals designate like elements throughout the drawings.

Figure 3:
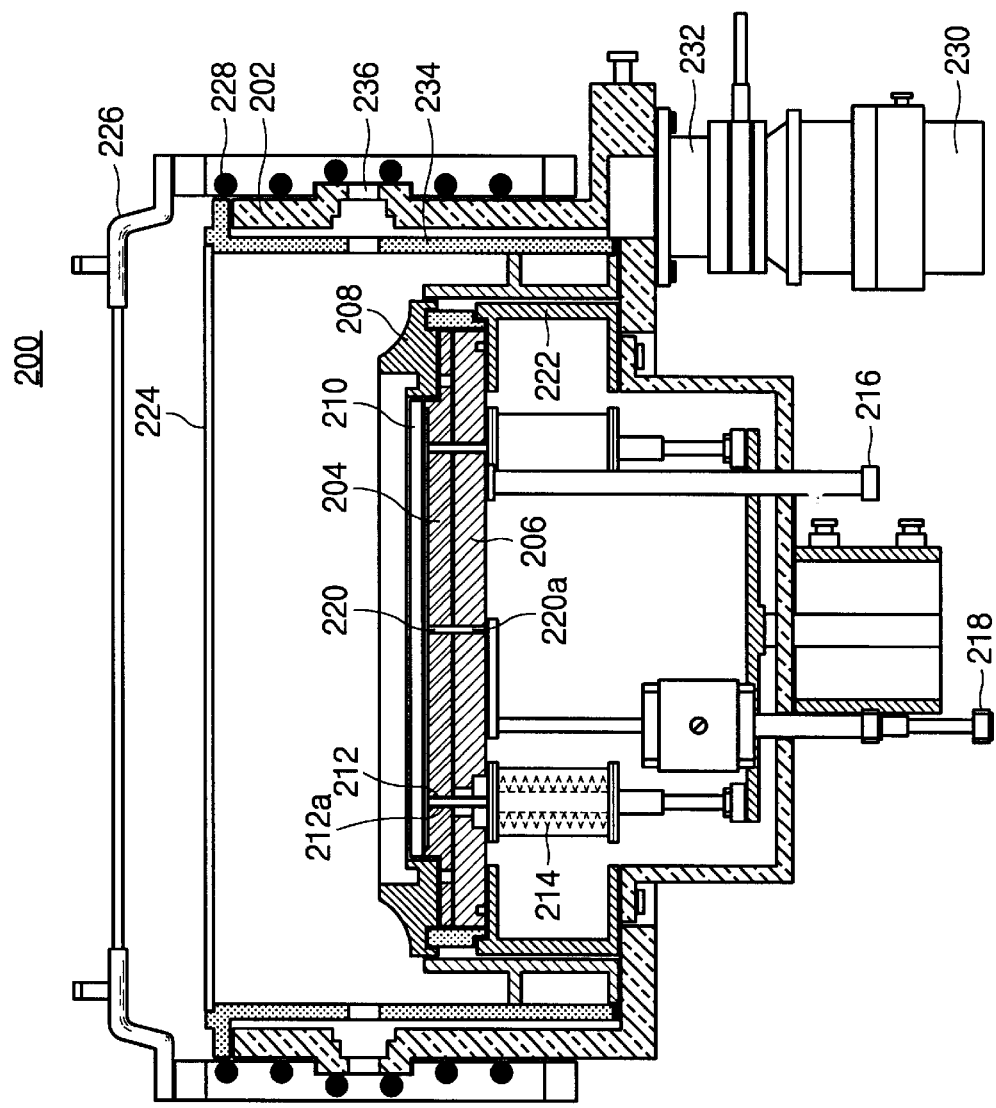
FIG. 3 is a cross-sectional view of a plasma processing apparatus having a focus ring in accordance with the present invention.
Figure 4:
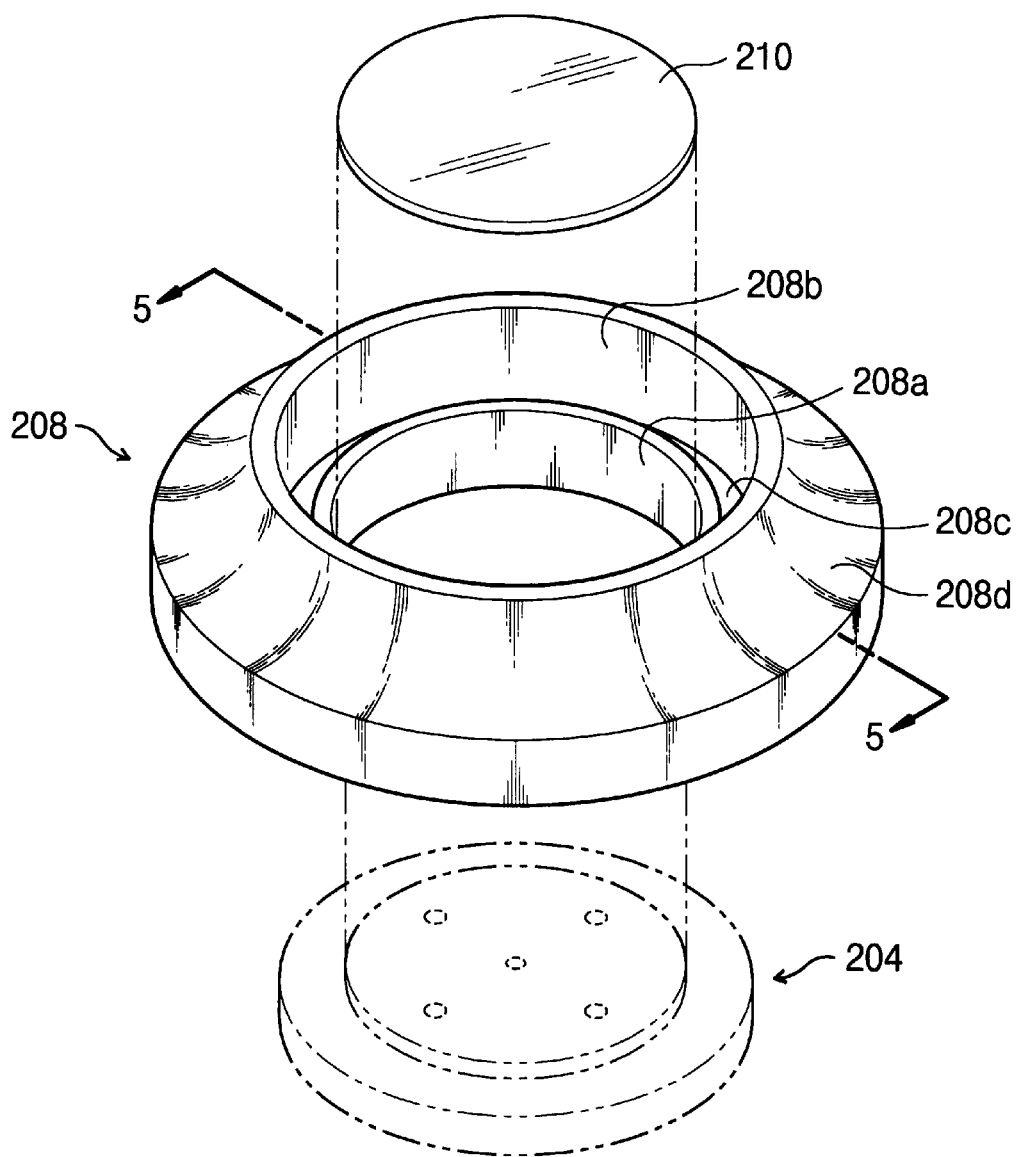
FIG. 4 is a perspective view of a focus ring in accordance with the present invention.

Referring first to FIGS. 3–4, a chuck unit is disposed within a process chamber 200. The chuck unit includes a disk-shaped electrostatic chuck 204, a cathode 206 located under the electrostatic chuck 204, a focus ring 208 mounted on the electrostatic chuck 204, and a lift pin assembly comprising lift pins 212 and lift pin bellows 214. The lift pins 212 contact a semiconductor wafer 210 resting on the electrostatic chuck 204, and the lift pin bellows 214 move the lift pins 212 vertically. The electrostatic chuck 204 has a thick central portion for supporting the wafer 210 and a thin flange, which are unitary with one another.

The electrostatic chuck 204 holds the semiconductor wafer 210 thereto as follows. A high voltage of, for example, 2.0 kV is impressed across the electrostatic chuck 204 by the cathode 206, whereby polarization creates an electrostatic force on a surface of the electrostatic chuck 204. The charge of the electrostatic force attracts the wafer 210 to the surface of the electrostatic chuck 204.

In addition, at least one first gas hole 220 extends through the electrostatic chuck 204. Similarly, the cathode 206 has a second gas hole 220a located in-line with the first gas hole 220. A gas (e.g., Ar, He, and $O_2$) is supplied from a cooling gas source 218 to the undersurface of the wafer 210 via the gas holes 220 and 220a for cooling the wafer 210. The cathode 206 is coupled to an RF receptor 216 to receive high frequency power.

After the pressure in a load-lock chamber (not shown) is equalized to that within the process chamber 200 or is increased to a pressure greater than that in the process chamber 200 within a predetermined limit, a gate valve 236 is opened and the wafer 210 is carried into the process chamber 200 through the open gate valve 236 by a conveyor (not shown). At this time, the lift pin bellows 214 are operated to lift up the lift pins 212 within a plurality of holes 212a that extend through the cathode 206 and the electrostatic chuck 204. The wafer 210 is loaded on raised the lift pins 212, and then the lift pins 212 are lowered by the lift pin bellows 214. The wafer 210 is thus safely positioned on the electrostatic chuck 204.

Plasma or etching gas (e.g., $CF_4$) is directed to a gas distribution plate (GDP) 226. The etching gas is then sprayed downwardly into the process chamber 200 through small holes in a top lid 224 that is supported on an insulating sidewall 234 of the process chamber 200.

A coil 228 is disposed on the process chamber 200, and is connected to a high frequency power source (not shown). High frequency current flows through the coil to induce a field in the process chamber 200 which converts the gas into plasma. The plasma impinges the wafer 210, creating reactive ions which penetrate the wafer 210 vertically and thereby etch the wafer 210. The etching process creates reaction by-products which are exhausted to the exterior of the process chamber 200 through an exhaust pipe 232 coupled to the sidewall 234.

The focus ring 208 is disposed at the flange of the electrostatic chuck 204, and surrounds the wafer 210. The focus ring 208 is made of ceramic or quartz which rarely react with chemicals but nonetheless react with processing gases at high temperatures. The focus ring 208 focuses the process gases onto the surface of the wafer 210, leading to a uniform distribution of the processing gases over the wafer 210. The focus ring 208 has a stepped inner periphery comprising (FIGS. 4 and 5) a cylindrical lower surface 208a, a cylindrical upper surface 208b, and a collector 208c. The lower surface 208a surrounds the wafer 210 and has a first diameter. The upper surface 208b has a second diameter which is greater than the first diameter. The collector 208c collects contaminants initially adhering to the upper surface 208b. In particular, the collector 208c can form an upwardly facing concavity located between the lower surface 208a and the upper surface 208b so as to collect particulate contaminants falling in a direction toward the surface of the wafer 210.

Figure 5:
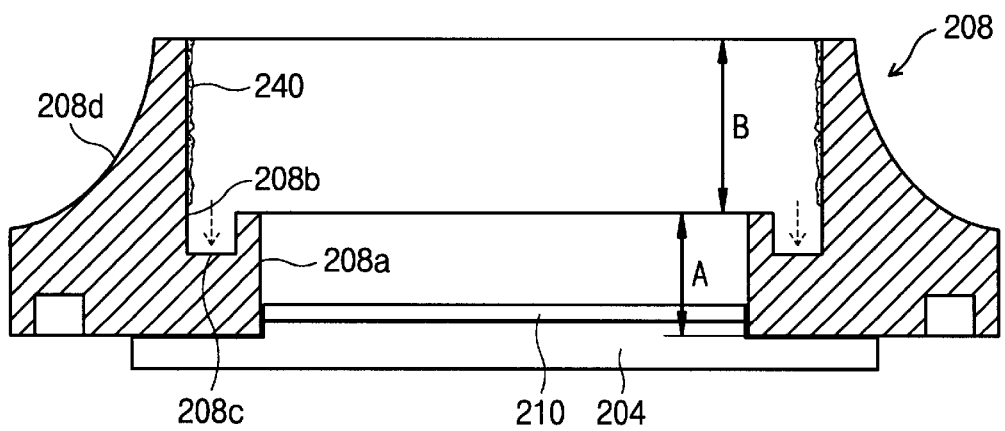
FIG. 5 is a cross-sectional view of the focus ring, taken along line 5—5 of FIG. 4.

Referring specifically to FIG. 5, the inner surface reacts with the processing gases during the etching process to create by-products 240, which tend to attach to an upper portion of the inner periphery (the upper surface 208b having a height B). In general, the by-products 240 rarely attach to the lower third of the total focus ring. Accordingly, the lower surface 208a is designed to have a height A which is a third or less of the total height of the focus ring 208. Therefore, most of the contaminants attach to the upper surface 208b. Because the collector 208c is located between the upper surface 208b and the lower surface 208a, the particulate contaminants 240 fall downwardly into the collector 208c. The falling contaminants are collected in the concavity formed by the collector 208c. The collector 208c shown in FIGS. 4–5 has a rectangular sectional profile, whereby particulate contaminants are effectively collected thereby.

Still referring to FIGS. 4–5, the height and diameter of the focus ring 208 are identical to those of a conventional focus ring. The height of the focus ring 208 is about 27 mm. Because the lower surface 208a should avoid producing by-products, the height of the lower surface 208a is a third of the total height of the focus ring 208, i.e., about 9 mm. The radially outermost peripheral surface 208d of the focus ring 208 is concave, so that the processing gases do not linger thereon but flow smoothly therefrom.

Figure 6A:
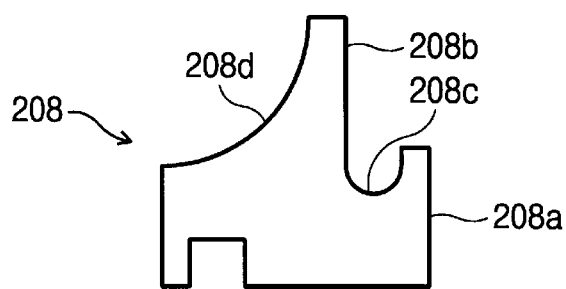
FIGS. 6A–6D are sectional views of various focus rings in accordance with the present invention.
Figure 6B:
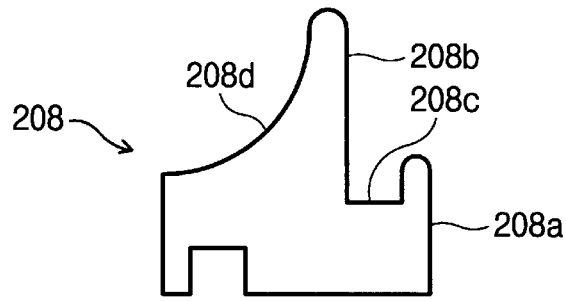
Figure 6C:
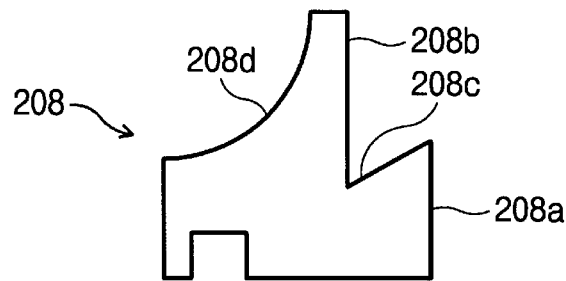
Figure 6D:
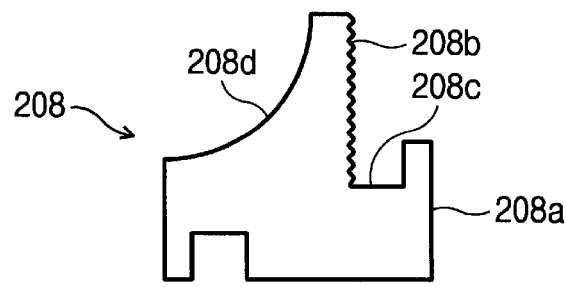

FIGS. 6A–6D show various modifications of the focus ring. A collector 208c having a semi-circular profile is shown in FIG. 6A. As shown in FIG. 6B, the lower and upper surfaces of 208a and 208b terminate at rounded edges of constant radii of curvature, which edges enhance the function of the collector 208c. In FIG. 6c, the collector 208 comprises a frusta-conical surface which is inclined downwardly in a direction from the lower surface 208a to the upper surface 208b. As shown in FIG. 6D, the upper surface 208b is surface-hardened and roughened to increase the surface area thereof. Therefore, the particulate contaminants attach more securely to the upper surface 208b and are thus less likely to fall towards the wafer.

Figure 7:
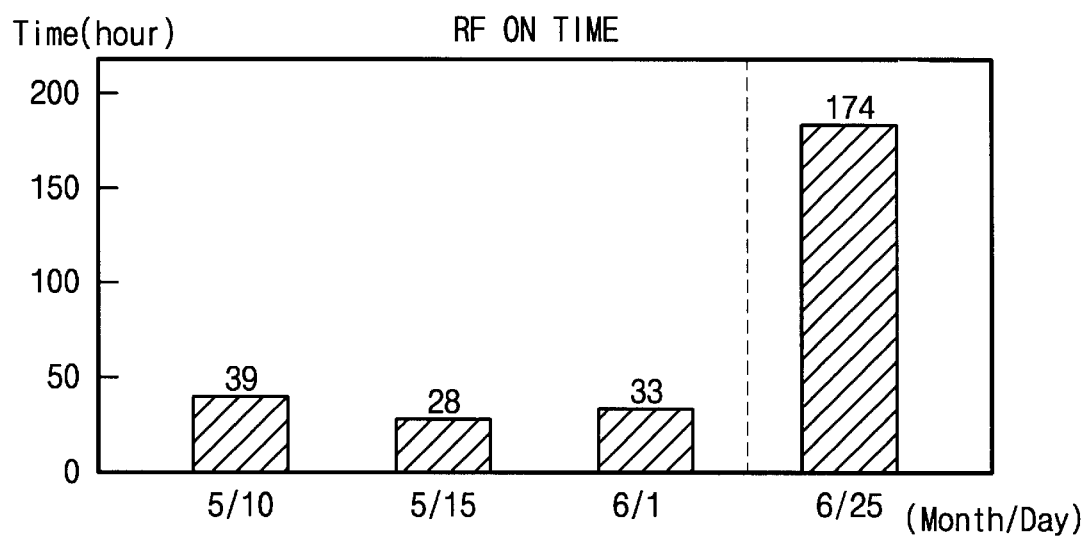
FIG. 7 is a graph showing RF on times of a conventional apparatus and an apparatus of the present invention.

FIG. 7 is a graph showing RF on times of apparatus incorporating the conventional focus ring and the focusing ring according to the present invention, respectively. RF on time is the total time from the start of a process using high frequency energy to the time the process must be stopped due to excessive particulate contaminants created in the process chamber. As shown in FIG. 7, the RF on times of an apparatus in which a conventional focus ring is installed in a process chamber are 39 hours (May 10), 28 hours (May 15), and 33 hours (June 1). Usually, the conventional RF on time is within a range of 30–40 hours, and is nearly always less than 70 hours. However, the RF on time of an apparatus in which the focus ring of the present invention is installed is 174 hours. This means that due to the focus ring of the present invention, the particulate contaminants created in the chamber are prevented from contaminating the wafers.

As is clear from the description above, the amount of contaminants falling onto a semiconductor wafer is greatly reduced by a collector located between a lower surface and an upper surface of the inner periphery of a focus ring, thereby ensuring the quality of the wafer. In addition, the RF on time of an apparatus employing the focus ring of the present invention is as much as two times greater or more than that of an identical apparatus employing a conventional focus ring. Thus, the present invention greatly increases the time between cleanings, thereby enhancing productivity associated with the manufacturing process performed by the apparatus.

Although the present invention has been described with reference to the preferred embodiments thereof, various modifications thereof will be readily apparent to those of ordinary skill in the art. All such modifications are seen to be within the true spirit and scope of the invention as defined by the appended claims.

What is claimed is:

1. An apparatus for a semiconductor wafer, the apparatus comprising:

a process chamber;

a circular chuck disposed in said process chamber, said chuck having a portion dedicated to support a semiconductor wafer thereon; and a focus ring disposed at the outer periphery of said chuck, said focus ring having a stepped inner periphery comprising a cylindrical lower surface extending around said portion of the chuck, a cylindrical upper surface having a diameter greater than that of said cylindrical lower surface and extending upwardly substantially beyond the upper surface of said portion of the chuck dedicated to support a semiconductor wafer so as to focus the processing medium onto the wafer held by said chuck, and a collector interposed between said lower surface and said upper surface, said collector being located beneath said upper surface and radially outwardly of said lower surface so as to collect contaminants from said upper surface towards said chuck and thereby prevent the contaminants form falling onto a wafer held by the chuck.

2. The apparatus of claim 1, and further comprising means for producing plasma in said process chamber.

3. The apparatus of claim 1, wherein said collector forms an upwardly facing concavity.

4. The apparatus of claim 1, wherein said focus ring has an outer periphery comprising a concave curved surface.

5. The apparatus of claim 1, wherein the height of said lower cylindrical surface is a third of the total height of said focus ring.

6. The apparatus of claim 1, wherein said lower cylindrical surface extends upwardly beyond the upper surface of said portion of the chuck dedicated to support a semiconductor wafer.

7. An apparatus for processing a semiconductor wafer using plasma, the apparatus comprising:

a process chamber;

an exhaust pump connected to said process chamber for evacuating the process chamber to produce a vacuum therein;

a gas supplier for supplying processing gas into the process chamber;

means for changing the processing gas into plasma;

an electrostatic chuck disposed in said process chamber for holding the semiconductor wafer with an electrostatic force, said electrostatic chuck having a portion dedicated to support the semiconductor wafer held thereto; and a focus ring disposed at the outer periphery of said electrostatic chuck, said focus ring having a stepped inner periphery comprising a cylindrical lower surface extending around said portion of the electrostatic chuck, a cylindrical upper surface having a diameter greater than that of said cylindrical lower surface and extending upwardly substantially beyond the upper surface of said portion of the electrostatic chuck dedicated to support a semiconductor wafer so as to focus the processing medium onto the wafer held by said chuck, and a collector interposed between said lower surface and said upper surface, said collector being located beneath said upper surface and radially outwardly of said lower surface so as to collect contaminants falling from said upper surface towards said chuck and thereby prevent the contaminants form falling onto a wafer held by the chuck.

8. The apparatus of claim 7, wherein said collector forms an upwardly facing concavity.

9. The apparatus of claim 7, wherein said focus ring has an outer periphery comprising a concave curved surface.

10. The apparatus of claim 7, wherein the height of said lower cylindrical surface is a third of the total height of said focus ring.

11. The apparatus of claim 7, wherein said lower cylindrical surface extends upwardly beyond the upper surface of said portion of the electrostatic chuck dedicated to support a semiconductor wafer.

12. A focus ring for use in focusing a processing medium onto a semiconductor wafer held by a chuck in a process chamber of a semiconductor manufacturing apparatus, said focus ring comprising an annular body having an outer periphery formed by a curved concave surface, and a stepped inner periphery formed of a cylindrical lower surface, a cylindrical upper surface having a diameter greater than that of said cylindrical lower surface, and a collector interposed between said lower surface and said upper surface, said collector being located beneath said upper surface and radially outwardly of said lower surface so as to collect contaminants falling from said upper surface.

* * * * *